United States Patent
Su et al.

(10) Patent No.: US 8,284,561 B2
(45) Date of Patent: Oct. 9, 2012

(54) EMBEDDED COMPONENT PACKAGE STRUCTURE

(75) Inventors: Yuan-Chang Su, Taoyuan County (TW); Shih-Fu Huang, Hsinchu County (TW); Bernd Karl Appelt, Gulf Breeze, FL (US); Ming-Chiang Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 187 days.

(21) Appl. No.: 12/850,872

(22) Filed: Aug. 5, 2010

(65) Prior Publication Data
US 2012/0033394 A1     Feb. 9, 2012

(51) Int. Cl.
*H05K 1/18*     (2006.01)
*H05K 1/11*     (2006.01)

(52) U.S. Cl. ........ 361/761; 361/762; 361/764; 174/260; 174/262; 257/687

(58) Field of Classification Search .......... None
See application file for complete search history.

(56) References Cited

U.S. PATENT DOCUMENTS

| | | | | |
|---|---|---|---|---|
| 5,432,677 A | * | 7/1995 | Mowatt et al. | 361/719 |
| 7,999,197 B1 | * | 8/2011 | Sawyer et al. | 174/522 |
| 8,039,939 B2 | * | 10/2011 | Hwang | 257/680 |
| 8,130,507 B2 | * | 3/2012 | Origuchi et al. | 361/760 |
| 8,159,828 B2 | * | 4/2012 | Sun et al. | 361/761 |
| 8,183,465 B2 | * | 5/2012 | Suzuki et al. | 174/260 |
| 2010/0208442 A1 | * | 8/2010 | Asano et al. | 361/783 |

FOREIGN PATENT DOCUMENTS

| | | |
|---|---|---|
| CN | 101728363 | 6/2010 |
| JP | 07-099391 | 4/1995 |
| WO | WO 2010/035866 | 4/2010 |

OTHER PUBLICATIONS

Chinese First Examination Report of China Application No. 201010250561.9, dated Sep. 7, 2011.

* cited by examiner

*Primary Examiner* — Boris Chervinsky
(74) *Attorney, Agent, or Firm* — J.C. Patents

(57) ABSTRACT

The present invention directs to fabrication methods of the embedded component package structures by providing preformed lamination structures, joining or stacking the preformed laminate structures and mounting at least one electronic component to the joined structures. By way of the fabrication methods, the production yield can be greatly improved with lower cycle time.

19 Claims, 13 Drawing Sheets

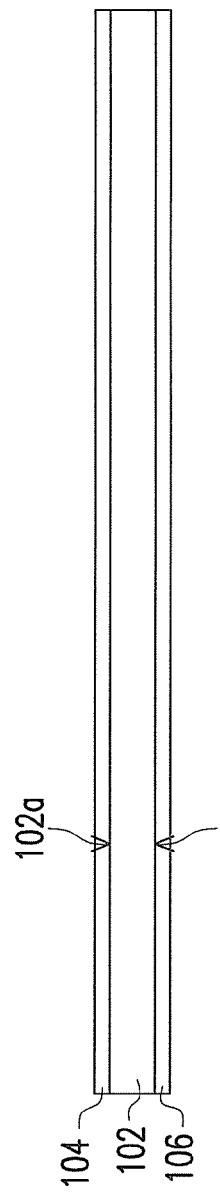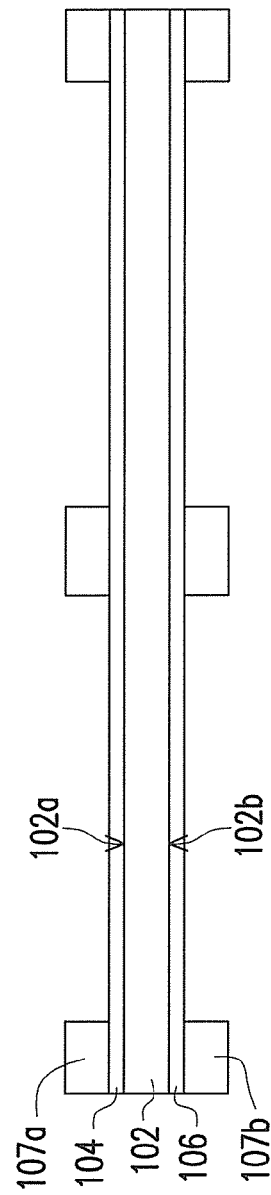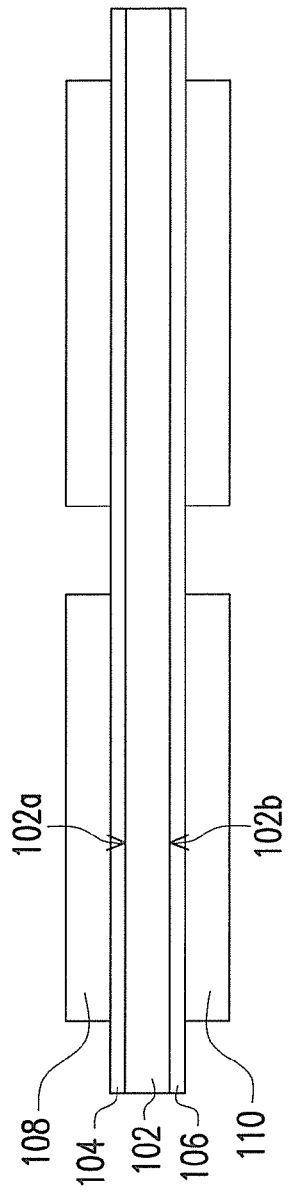

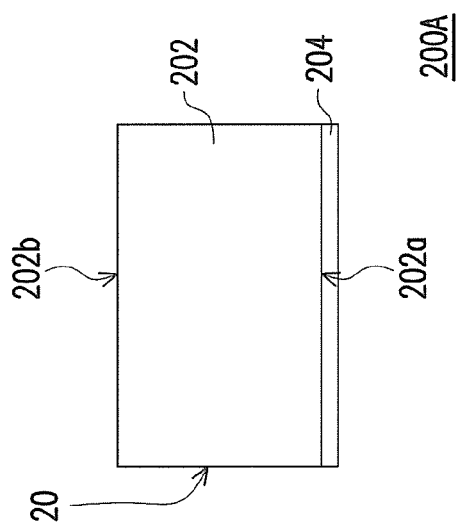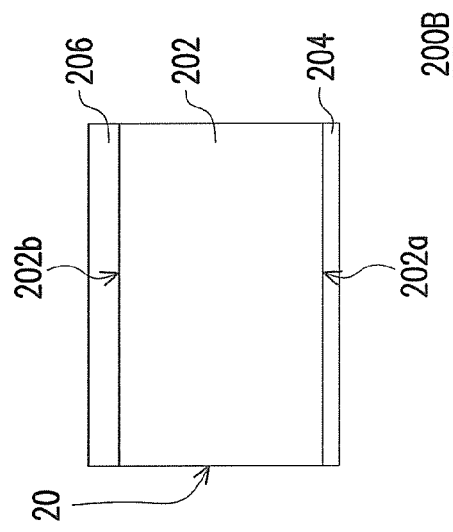
FIG. 2A
FIG. 2B

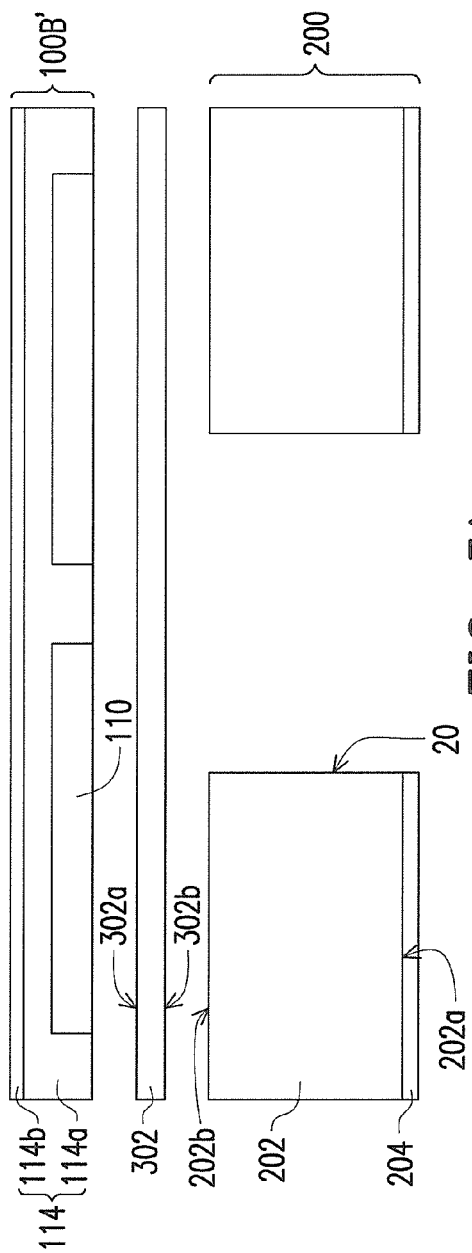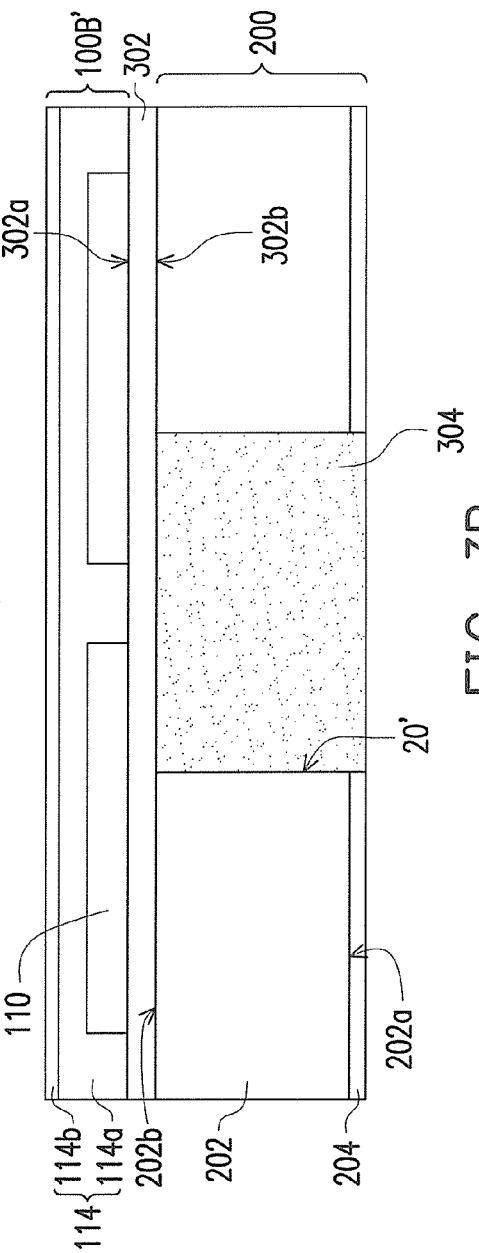

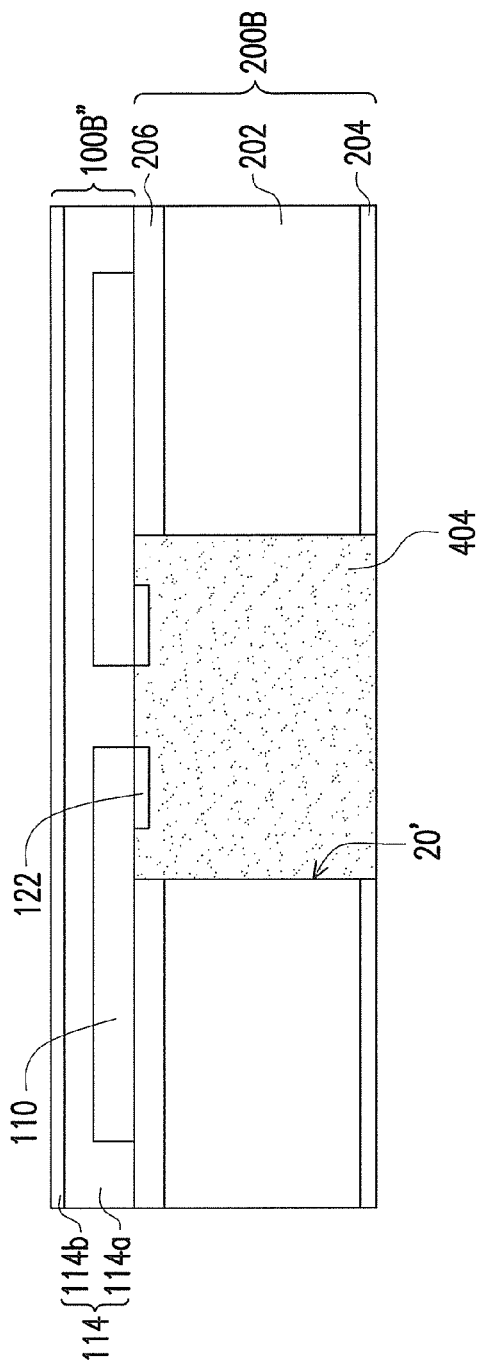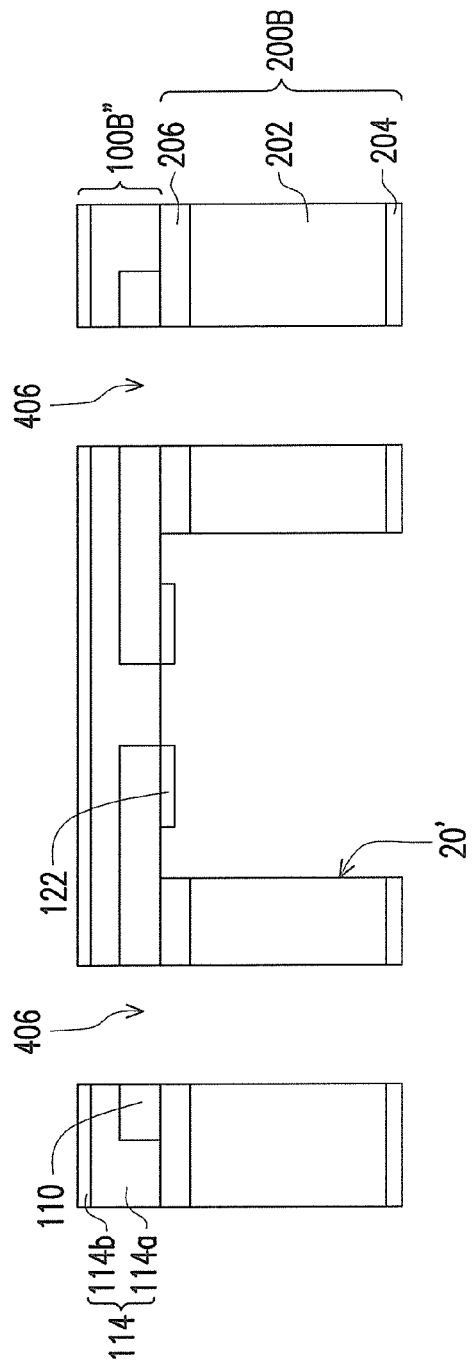
FIG. 4A
FIG. 4B

EMBEDDED COMPONENT PACKAGE STRUCTURE

BACKGROUND OF THE INVENTION

1. Field of the Invention

The present invention relates to a chip package structure and a fabricating method thereof. More particularly, the present invention relates to a fabrication method of an embedded component package structure and the package structure thereof.

2. Description of Related Art

For satisfying the trends of light weight and compactness on electronic products in the market, package structures with the embedded components have become popular. However, as the electronic components are usually standardized and have specific electric properties, the fabrication of the embedded component package structure for accommodating the electronic components with various electric properties has to be custom-made with relatively low yield and has long cycle time.

For facilitating the further implementation of this technology, it is desirable to simplify the fabrication of the embedded component package structure, so as to increase the yield and lower the production costs.

SUMMARY OF THE INVENTION

Accordingly, the present invention is directed to a fabrication method of an embedded component package structure and/or a cavity substrate, which is capable of increasing the productivity or yield and is compatible with the present manufacturing processes.

As embodied and broadly described herein, the present invention directs to methods of fabricating an embedded component package structure. The fabrication method generally includes first supplying various preformed structural parts (or laminate structures). A first laminate structure and a second laminate structure are joined to an interlayer. The first laminate structure has a first double-layered sheet and a first metal layer disposed on the first double-layered sheet. The first double-layer sheet consists of a first dielectric layer and a second metal layer, the first and second metal layers are separated by the first dielectric layer and the first dielectric layer is sandwiched between the first and second metal layers. The second laminate structure has at least a hollow space therein, and the second laminate structure consists of a third metal layer and a second dielectric layer disposed on the third metal layer. The second dielectric layer of the second laminate structure is joined to the second surface of the interlayer, while the first dielectric layer and the second metal layer of the first double-layer sheet is joined to the first surface of the interlayer. The at least hollow space covered by the interlayer turns into at least a cavity exposing a part of the interlayer. Later a drilling process is performed to the form a plurality of through holes and a plurality of plated-through hole structures is formed to cover the plurality of the through holes and in the first laminate structure, the interlayer and the second laminate structure joined together. After mounting at least an electronic component to the plurality of the bonding pads, an encapsulant is formed to fill the cavity, so that the at least electronic component is embedded within the encapsulant.

According to embodiments of the present invention, the bonding pads may be provided in the preformed laminate structure or can be fabricated after forming the plated-through holes structures.

According to embodiments of the present invention, the interlayer may be joined to the preformed laminate structure before or after joining the provided laminate structures.

In an embodiment of the present invention, the interlayer is made of a no-flow pre-impregnated material and joining the first and second laminate structures with the interlayer comprises performing a thermal compression process.

In an embodiment of the present invention, the fabrication method may further comprise performing a surface treating process to the bonding pads.

The present invention further provides a package structure. The package structure includes a first laminate structure having a first double-layered sheet and a first metal layer disposed on the first double-layered sheet, a second laminate structure having a third metal layer, a second dielectric layer disposed on the third metal layer and at least a cavity therein, an interlayer joining the first laminate structure and the second laminate structure, a plurality of plated-through hole structures extending through the first laminate structure, the interlayer and the second laminate structure, a plurality of bonding pads, at least an electronic component mounted on the plurality of the bonding pads, and an encapsulant, filling up the at least cavity and encapsulating the at least electronic component.

In the present invention, the package structure with the electronic component embedded within the encapsulant in the cavity, which protects the electronic component.

In order to make the aforementioned and other objects, features and advantages of the present invention comprehensible, embodiments accompanied with figures are described in detail below. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A-1G' are cross-sectional views showing the fabricating process steps of structural parts of a substrate according to an embodiment of the present invention.

FIGS. 2A-2B are cross-sectional views showing various structural parts of the substrate according to an embodiment of the present invention.

FIGS. 3A-3G are cross-sectional views showing the fabricating process steps of the cavity substrate and the package structure according one embodiment of the present invention.

FIGS. 4A-4D are cross-sectional views showing the fabricating process steps of the cavity substrate according another embodiment of the present invention.

DESCRIPTION OF EMBODIMENTS

Figure 1D:
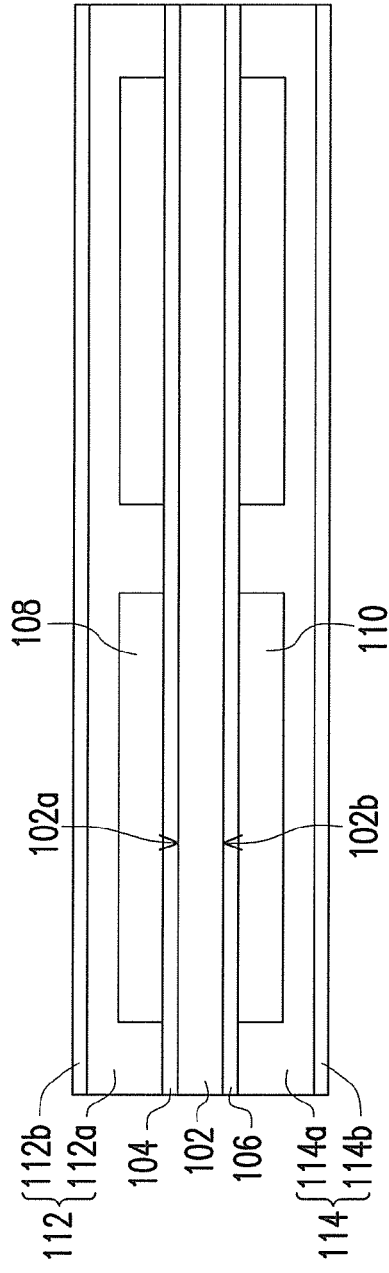

The present invention is described below in detail with reference to the accompanying drawings, and the embodiments of the present invention are shown in the accompanying drawings. However, the present invention can also be implemented in a plurality of different forms, so it should not be interpreted as being limited in the following embodiments. Actually, the following embodiments are intended to demonstrate and illustrate the present invention in a more detailed and completed way, and to fully convey the scope of the present invention to those of ordinary skill in the art. In the accompanying drawings, in order to be specific, the size and relative size of each layer and each region may be exaggeratedly depicted.

It should be known that although "first", "second", "third" and the like are used in the present invention to describe each element, region, layer, and/or part, such words are not intended to restrict the element, the region, the layer, and/or the part, either in sequential orders or in relative positions, but shall be considered to distinguish one element, region, layer, or part from another. Therefore, under the circumstance of without departing from the teaching of the present invention, the first element, region, layer, or part can also be called the second element, region, layer, or part.

In addition, "upper", "lower", "top", "bottom", "under", "on", and similar words for indicating the relative space position are used in the present invention to illustrate the relationship between a certain element or feature and another element or feature in the drawings. It should be known that, beside those relative space words for indicating the directions depicted in the drawings, if the element/structure in the drawing is inverted, the element described as "upper" element or feature becomes "lower" element or feature.

FIGS. 1A-1G' are cross-sectional views showing the fabricating process steps of structural parts of a substrate according to an embodiment of the present invention.

Referring to FIG. 1A, a double-sided lamination structure 100 is provided, which has a first metal layer 104 disposed on a top surface 102a of the core structure 102 and a second metal layer 106 disposed on a bottom surface 102b of the core structure 102. The material of the first and the second metal layers 104, 106 may be copper formed by electroplating or copper foil lamination, for example. The thickness of the first and the second metal layers 104, 106 may be about 18 microns, for example. The double-sided lamination structure 100 can be a copper clad laminate (CCL), while the core structure 102 may be a release film (such as Tedlar film) or a peelable mask film, for example.

In FIG. 1B, a first and second patterned photoresist layers 107a, 107b are respectively formed on the first and second metal layers 104, 106.

In FIG. 1C, using the first and second patterned photoresist layers 107a, 107b as the masks, a third metal layer 108 and a fourth metal layer 110 are respectively formed on the first and the second metal layers 104 and 106 and partially covering the first and second metal layers 104, 106. The material of the third and the fourth metal layers 108, 110 may be copper formed by electroplating, for example. The thickness of the third and the fourth metal layers 108, 110 may be about 10~30 microns, for example. Then, the first and second patterned photoresist layers 107a, 107b are removed. The patterns of the third and the fourth metal layers 108, 110 may correspond to the trace patterns.

In FIG. 1D, a first double-layered sheet 112 consisting of a first dielectric layer 112a and a fifth metal layer 112b is formed on the first and third metal layers 104, 108, while a second double-layered sheet 114 consisting of a second dielectric layer 114a and a sixth metal layer 114b is formed on the second and fourth metal layers 106, 110. The first and second dielectric layers may be made of pre-impregnated materials (prepregs), for example. The thickness of the fifth and the sixth metal layers 112b, 114b may be about 12 microns, for example. The first and second double-layered sheets 112, 114 are press-laminated to the metal layers by thermal compression, for example. In this case, the patterns of the dielectric layers 112a/114a are complementary to the patterns of the third and the fourth metal layers 108, 110.

Figure 1E:
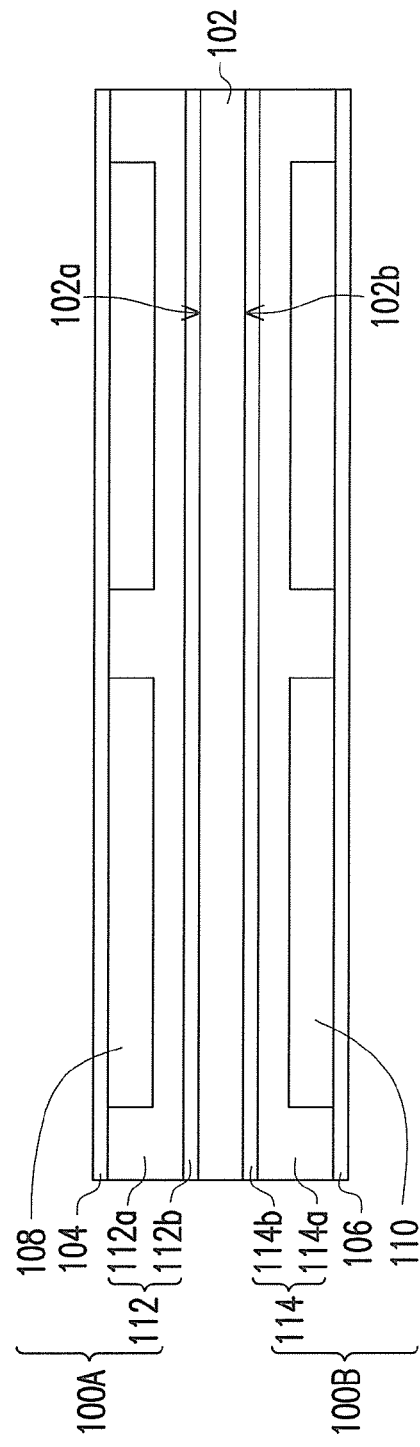

In FIG. 1E, the upper laminate structure 100A and the lower laminate structure 100B are respectively separated from the top and bottom surfaces 102a, 102b of the core structure 102. The upper laminate structure 100A and the lower laminate structure 100B are inverted (turned upside down) and then re-set (reaffix) to the top and bottom surfaces 102a, 102b of the core structure 102. The upper laminate structure 100A consists of the first and third metal layers 104, 108 and the first double-layered sheet 112, while the lower laminate structure 100B consists of the second and fourth metal layers 106, 110 and the second double-layered sheet 114.

Figure 1F:
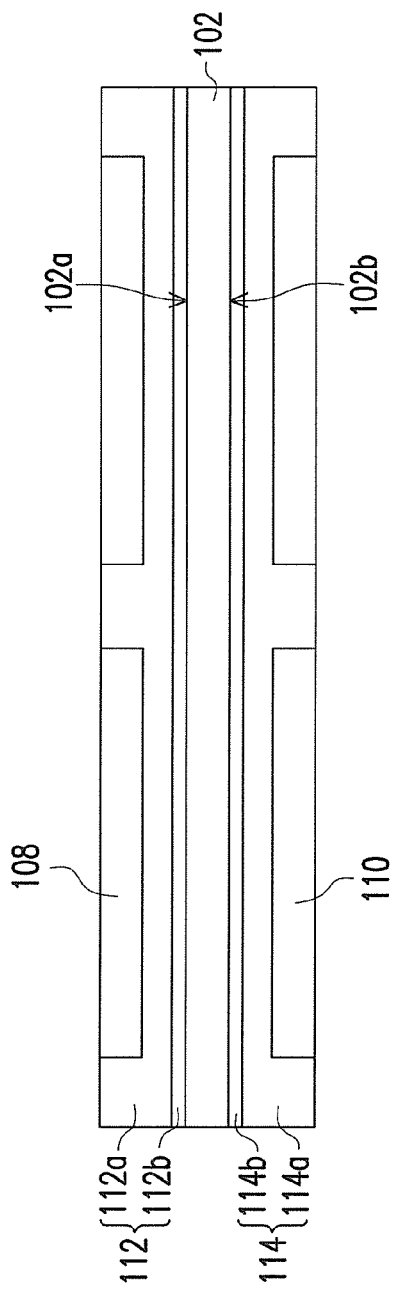

In FIG. 1F, the top most metal layer 104 (the first metal layer 104) and the bottom most metal layer 106 (the second metal layer 106) are respectively removed by etching, until the dielectric layers 112a, 114a are exposed. The exposed third and the fourth metal layers 108, 110 may function as traces in the package structures.

Figure 1G:
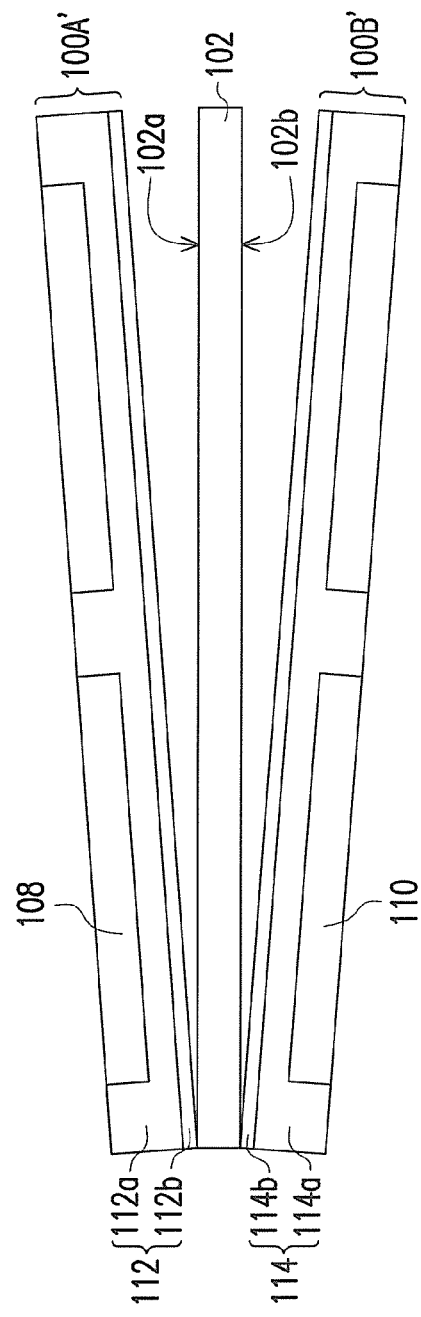
Figure 1G:
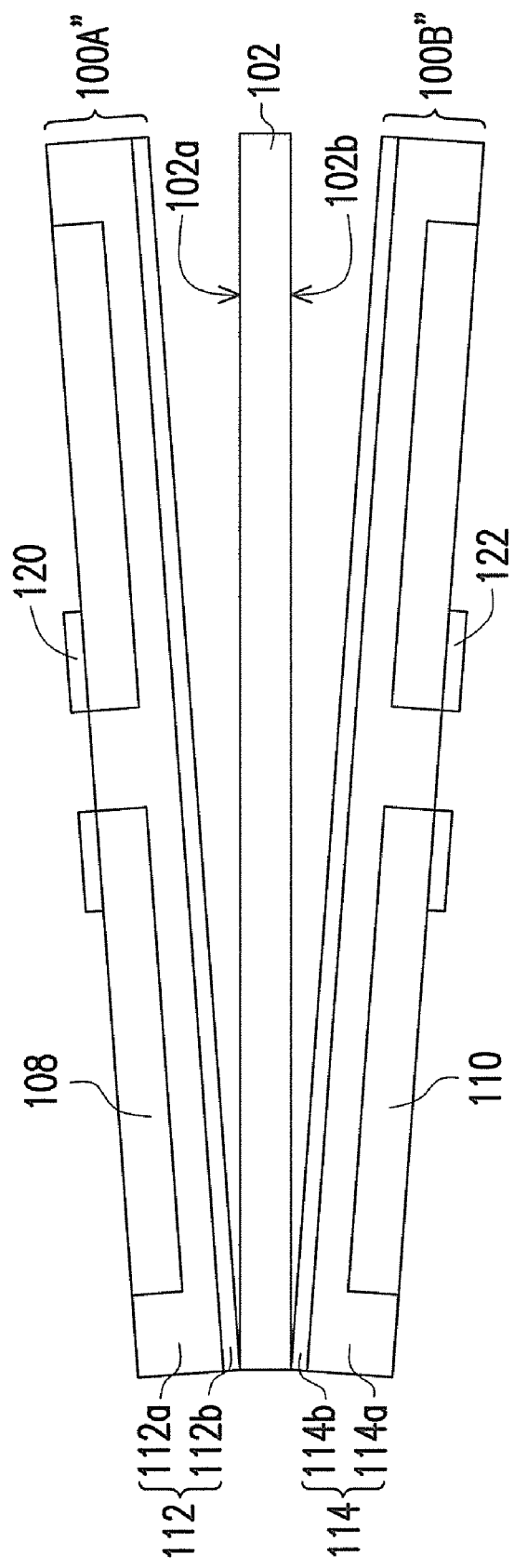

In FIG. 1G, the upper laminate structure 100A and the lower laminate structure 100B are respectively separated from the top and bottom surfaces 102a, 102b of the core structure 102, so that two laminate structures 100A', 100B' are obtained. The upper laminate structure 100A' consists of the third metal layer 108 and the first double-layered sheet 112, while the lower laminate structure 100B' consists of the fourth metal layer 110 and the second double-layered sheet 114.

Alternatively, following FIG. 1F, as shown in FIG. 1G', a plurality of first bonding pads 120 is formed on the exposed third metal layer 108 and a plurality of second bonding pads 122 is formed on the exposed fourth metal layer 110. The first and second bonding pads may be formed by tin plating with a thickness of about 3-5 microns, for example. Later, the upper and lower laminate structures are separated, and two laminate structures 100A", 100B" are obtained.

The laminate structures 100N/100B' or 100A"/100B" can be further used as structural parts for the cavity substrate in the present invention.

According to the fabrication process of the present invention, metal layers and passivation layers can be stacked on both surfaces of the temporary carrier (the core structure) as the double-sided lamination structure, and both sides of the lamination structure can be processed and then separated to provide patterned laminate structures.

Alternatively, as shown in FIG. 2A, the structure 200A consists of a core structure 202 and a metal layer 204 disposed on the bottom surface 202a of the core structure 202. The structure 200A includes at least one hollow space 20 penetrating through the whole structure 200A (i.e. from the top surface to the bottom surface). The core structure 202 may be made of pre-impregnated materials (prepregs) and further includes multiple metal layers or conductive trace patterns, for example. The metal layer 204 may be a copper layer with a thickness of about 3 microns, for example. The structure 200A can be fabricated from removing the metal layer from one side of a double-sided lamination structure and then performing a punching/routing process to the structure to form the hollow space.

Similarly, as shown in FIG. 2B, the structure 200B consists of a core structure 202 with a hollow space 20, a metal layer 204 disposed on the bottom surface 202a of the core structure 202 and an interlayer 206 disposed on the top surface 202b of the core structure 202. The material of the interlayer 206 can be no-flow pre-impregnated materials (prepregs), for example. The structure 200B can be fabricated from removing the metal layer from one side of a double-sided lamination structure, press laminating the interlayer to the core structure and then performing a punching/routing process to form the hollow space in the core structure. The structures 200A/200B can also be used as a structural part for the cavity substrate in the present invention.

The above described structural parts may be fabricated in advance as preformed structural parts and then assembled together.

FIGS. 3A-3G are cross-sectional views showing the fabricating process steps of the cavity substrate and the package structure according one embodiment of the present invention.

Firstly, referring to FIG. 3A, a laminate structure 100B', which has the double-layer sheet 114 (dielectric layer 114a and the metal layer 114b) and a metal layer 110, and the structure 200A consisting of the core structure 202 with a hollow space 20 and the metal layer 204 are provided. Later, an interlayer 302 is provided. In FIG. 3B, the laminate structure 100B' and the structure 200A are respectively joined to a top surface 302a and a bottom surface 302b of an interlayer 302, either in sequence or simultaneously, by compression. Preferably, the material of the interlayer 302 is no-flow pre-impregnated materials (prepregs), for example. The no-flow prepregs is partially cured and has little fluidity, so that the interlayer 302 will not flood into the hollow space 20. After the laminate structure 100B' and the structure 200A are joined with the interlayer 302, the hollow space 20 turns into a cavity 20' of the joined structure. Later, the cavity 20' may be filled with a filler 304, so that the cavity is protected during the subsequent drilling process. Generally, the filler 304 is packed with a release film, so that the filler 304 can be easily removed in the later process.

Figure 3C:
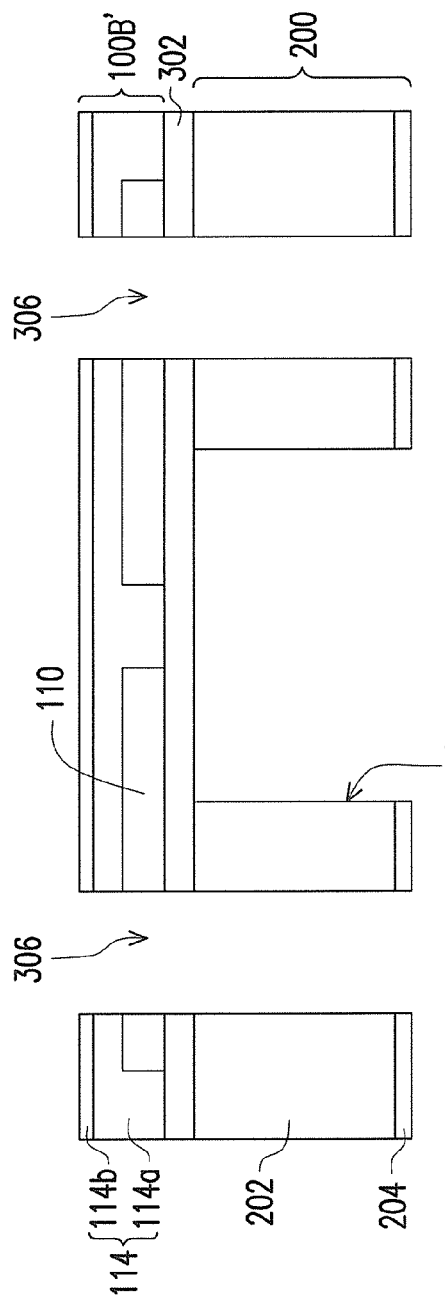

In FIG. 3C, a drilling process is performed to form a plurality of through holes 306. If the filler 304 is applied, the filler 304 is removed after the drilling process.

Figure 3D:
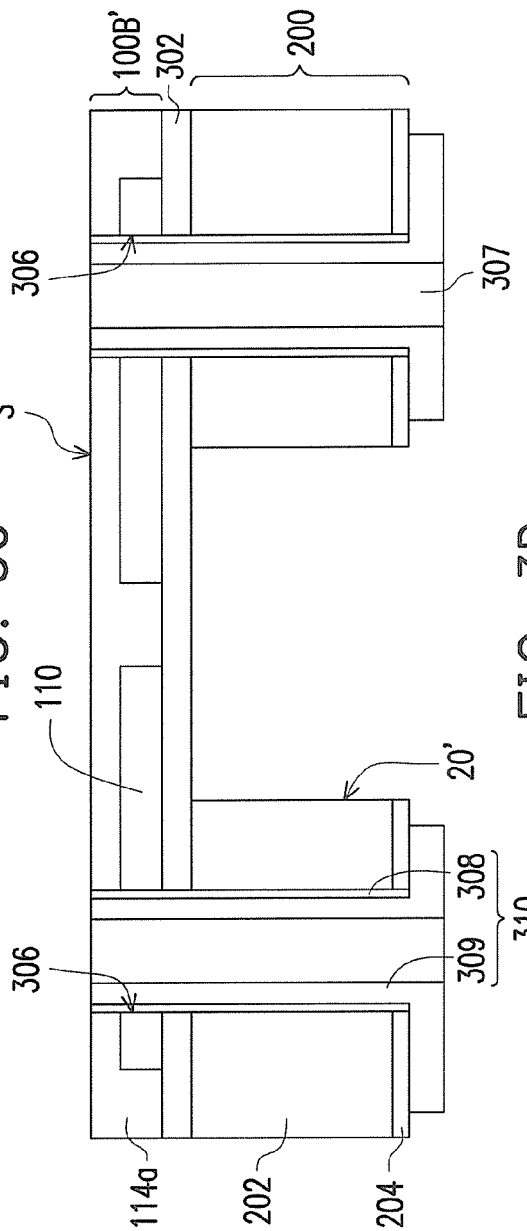

In FIG. 3D, a plating process is performed to the through holes 306 and a plurality of plated through hole structures 310 is formed. The formation of the plated through hole structures 310 may comprise forming a seed copper layer 308 on the sidewalls of the through holes 306 by electroless plating, electroplating a copper layer (not shown) on the exposed surfaces of the joined structure and later performing etching to pattern the copper layer to form a plating layer 309 on the seed copper layer 308 and covering a portion of the metal layer 204 surrounding the through holes 306. Also, during the etching process, the copper layer and the metal layer 114b are removed. As shown in FIG. 3D, the seed copper layer 308 and the plating layer 309 of the plated through hole structures 310 is coplanar with and do not cover the exposed dielectric layer 114a. Such design can provide a flat top surface S and is compatible with the sensor circuit patterns for sensor applications. However, it is well-understood that the patterns of the plated through hole structures on either surface of the joined structure can be adjusted or modified according to the product design or electrical requirements. In addition, the though holes 306 may be protected by plugging with a filling material 307.

Figure 3E:
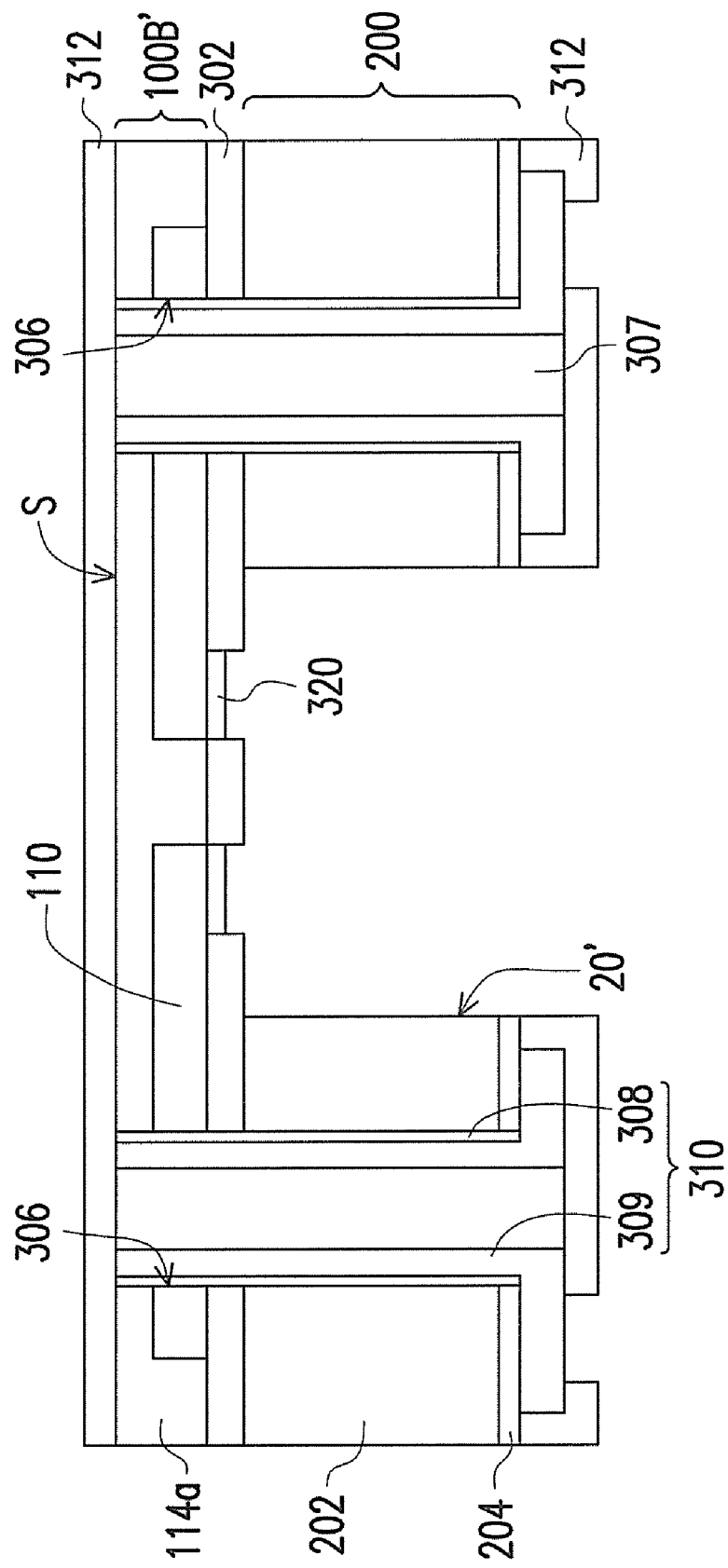

In FIG. 3E, a plurality of bonding pads 320 is formed within the interlayer 302 inside the cavity 20'. The formation of the bonding pads 320 may comprise laser drilling a plurality of openings in the interlayer 302 and then forming the bonding pads 320 within the openings by tin plating. Later, a surface treating process is performed to the bonding pads 320. The bonding pads 320 may have a thickness of about 3-5 microns and the surface treating process may be an immersion tin process or an organic solderabilty preservatives (OSP) process, for example.

In addition, the joined structure shown in FIG. 3E may further include a solder resist coating 312 over the flat surface S and around the plated through holes structures 310. The solder resist coating 312 may be printed before the formation of the bonding pads 320. As shown in FIG. 3E, the solder resist coating 312 exposes portions of the plating layer 309, which may function as ball pads in the subsequent process. At this stage, the structure shown in FIG. 3E can be considered as a cavity substrate 30.

Figure 3F:
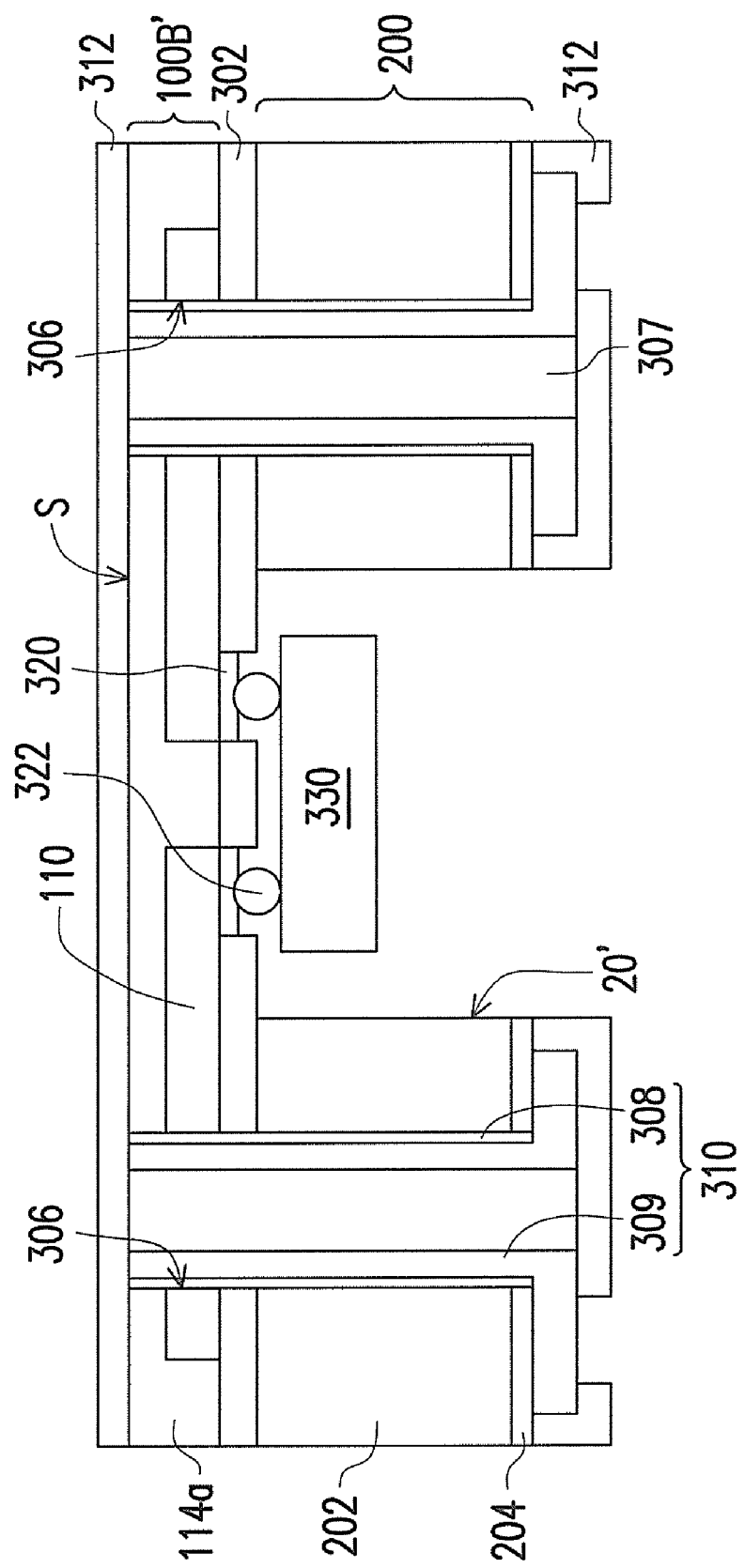

Referring to FIG. 3F, a plurality of bumps 322 is formed on the bonding pads 320. The bumps 322 can be made of gold or copper, for example. Later, an electronic component 330 is connected to the bumps 322 mounted on the bonding pads 320. The electronic component 330 can be an active component (such as a chip) or a passive component (such as a capacitor or a resistor).

Figure 3G:
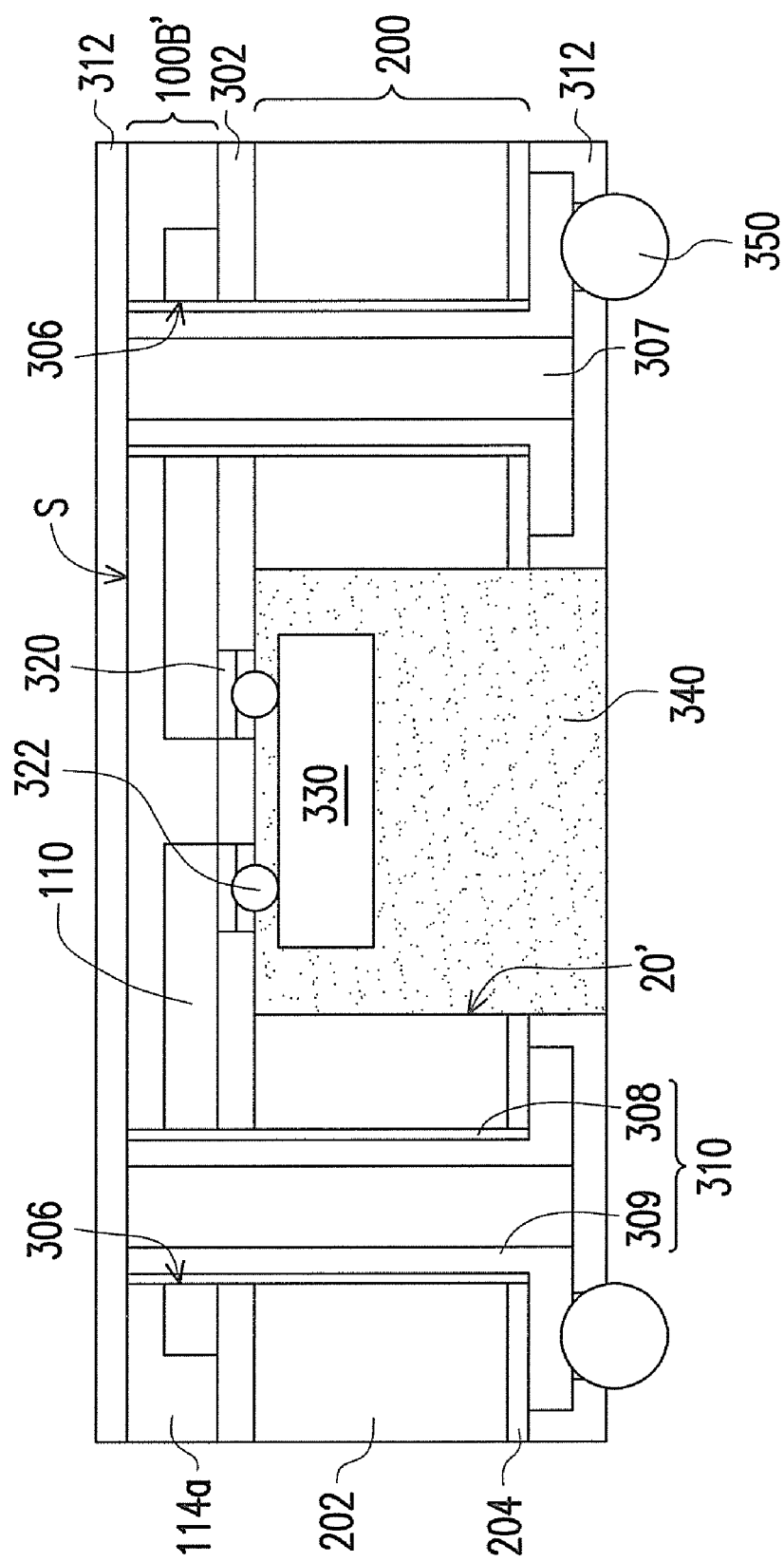

Next, in FIG. 3G, an encapsulant 340 is foamed to fill the cavity 20' and the electronic component 330 is embedded within the encapsulant 340, thus obtaining the embedded component package structure (the package structure with the embedded components). In this way, the embedded electronic component 330 is protected. If necessary, an underfill (not shown) may be further included. Later, a plurality of balls 350 is formed on the bottom surface of the joined structure (i.e. on the exposed portions of the plating layer 309).

FIGS. 4A-4D are cross-sectional views showing the fabricating process steps of the cavity substrate according another embodiment of the present invention.

Firstly, referring to FIG. 4A, a laminate structure 100B", which has the double-layer sheet 114 (dielectric layer 114a and the metal layer 114b), a metal layer 110 and a plurality of second bonding pads 122, is joined with the structure 200B consisting of the interlayer 206, the core structure 202 and the metal layer 204. The laminate structure 100B" and the structure 200B can be joined by compression. The interlayer 206 is partially cured at lower temperatures and has little fluidity, so that the interlayer 206 will not flood into the hollow space 20. After the laminate structure 100B" and the structure 200B are joined, the hollow space 20 of the core structure (FIG. 2B) turns into a cavity 20' of the joined structure. Later, the cavity 20' may be filled with a filler 404, so that the cavity is protected during the subsequent drilling process. Generally, the filler 404 is packed with a release film, so that the filler 404 can be easily removed in the later process.

In FIG. 4B, a drilling process is performed to form a plurality of through holes 406. If the filler 404 is applied, the filler 404 is removed after the drilling process.

Figure 4C:
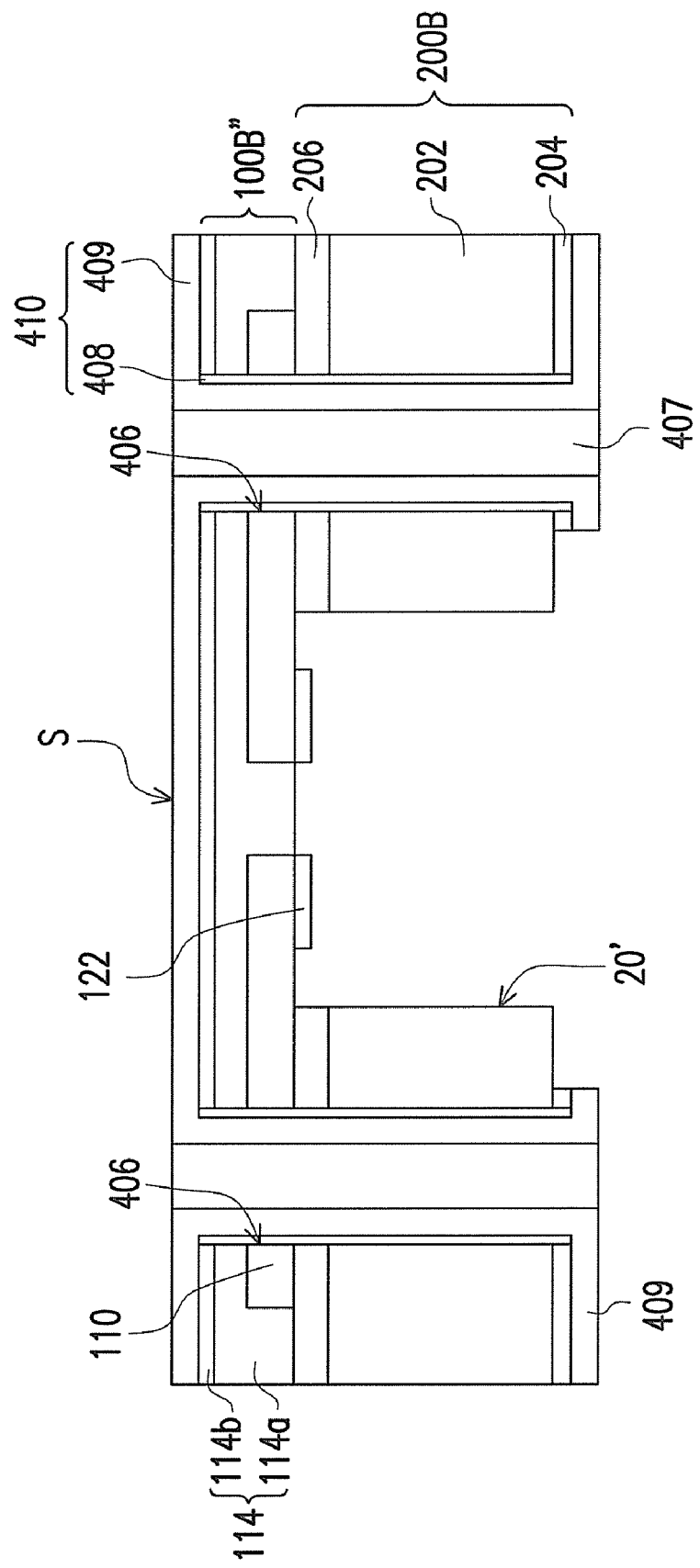

In FIG. 4C, a plating process is performed to the through holes 406 and a plurality of plated through hole structures 410 is formed. The formation of the plated through hole structures 410 may comprise forming a seed copper layer 408 on the sidewalls of the through holes 406 by electroless plating, electroplating a plating layer 409 on the exposed surfaces of the joined structure and later performing etching to pattern the plating layer 409 and the metal layer 204. The plating layer 409 covers the metal layer 204, the seed copper layer 408 and the metal layer 114b, except for covering the cavity 20'. As shown in FIG. 4C, a flat top surface S is provided by the seed copper layer 408 and the plating layer 409 of the plated through hole structures 410. Such design is compatible with the sensor circuit patterns. However, it is well-understood that the patterns of the plated through hole structures on either surface of the joined structure can be adjusted or modified according to the product design or electrical requirements. In addition, the though holes 406 may be protected by plugging with a filling material 407.

Figure 4D:
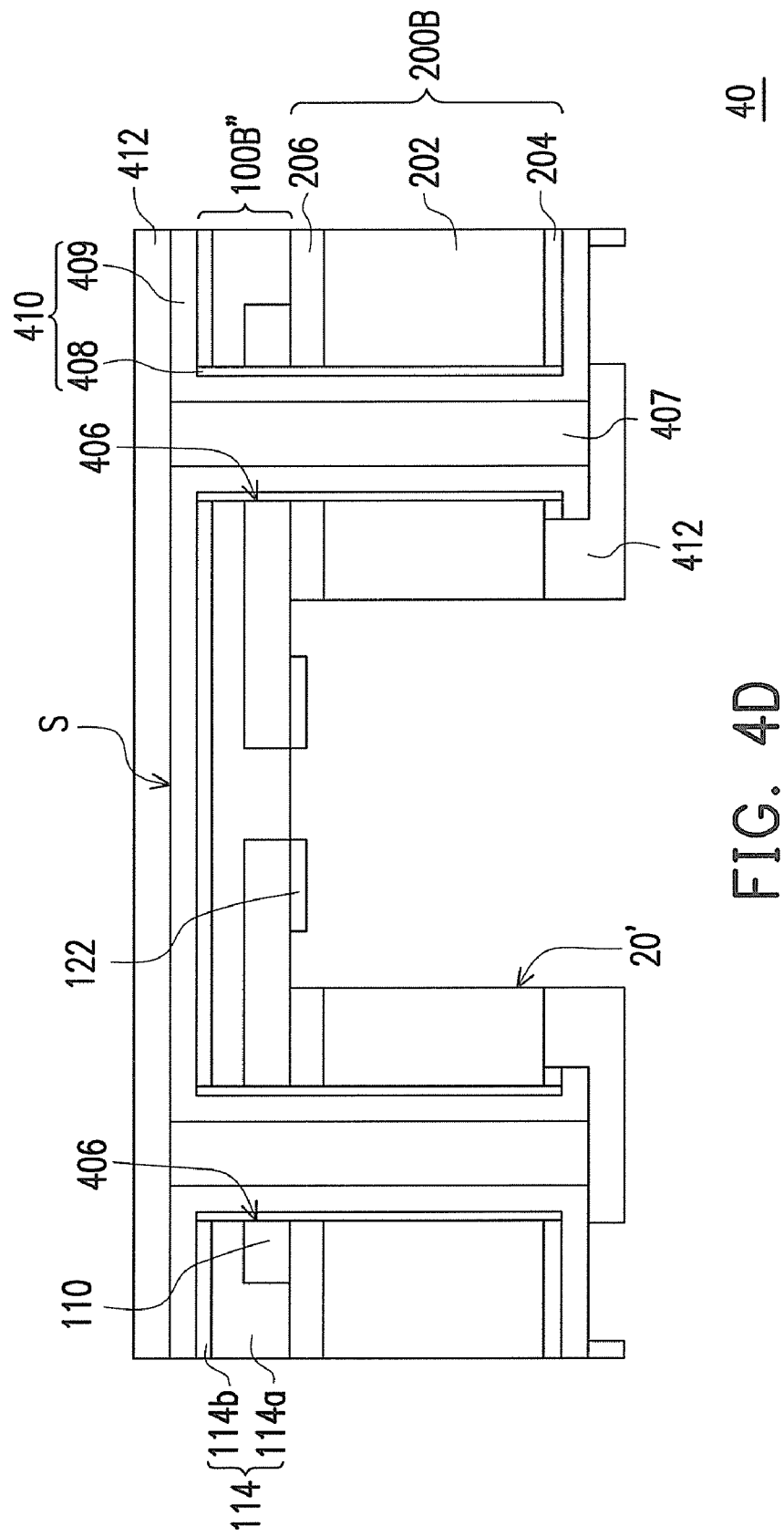

In FIG. 4D, a solder resist coating 412 is formed over the flat surface S and around the plated through holes structures 410. As shown in FIG. 4D, the solder resist coating 412 exposes portions of the plating layer 409, which may function as ball pads in the subsequent process. At this stage, the structure shown in FIG. 4D can be considered as a cavity substrate 40.

Subsequently, the cavity substrate 40 may be further assembled to obtain the package structure, either following the similar process steps described in FIGS. 3E-3G. or other compatible packaging process steps.

According to the fabrication process of the present invention, certain preformed structural parts can be fabricated from processing double-sided lamination structure, and the productivity can be practically doubled without wasting the processing materials or the production line. In addition, by providing preformed structural parts, not only the fabrication process of the present invention can efficiently fabricate the cavity substrate suitable for the embedded component package structure, but also the fabrication process can be provide the cavity substrate and/or the embedded component package structure with better reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
a first laminate structure having a first double-layered sheet and a first metal layer disposed below the first double-layered sheet, wherein the first double-layered sheet consists of a first dielectric layer and a second metal layer, the first and second metal layers are separated by the first dielectric layer and the first dielectric layer is sandwiched between the first and second metal layers;
a second laminate structure having at least a cavity therein, wherein the second laminate structure consists of a third metal layer and a second dielectric layer disposed on the third metal layer;
an interlayer joining the first laminate structure and the second laminate structure, wherein the first metal layer is joined to a surface of the interlayer and the second dielectric layer of the second laminate structure is joined to the opposite surface of the interlayer;
a plurality of bonding pads, located within the at least cavity and on the first metal layer;
a plurality of plated-through hole structures, extending through the first laminate structure, the interlayer and the second laminate structure;
at least an electronic component, electrically connected to and mounted on the plurality of the bonding pads; and
an encapsulant, filling up the at least cavity and encapsulating the at least electronic component.

2. The structure of claim 1, wherein a material of the first, second and/or third metal layers includes copper.

3. The structure of claim 1, wherein the interlayer is made of a no-flow pre-impregnated material.

4. The structure of claim 1, further comprising a solder resist coating respectively over surfaces of the first and second laminate structures.

5. The structure of claim 1, further comprising a plurality of bumps disposed between the at least electronic component and the plurality of the bonding pads.

6. The structure of claim 1, further comprising a plurality of balls disposed on the second laminate structure.

7. The structure of claim 5, wherein a material of the bumps includes copper or gold.

8. The structure of claim 1, wherein a material of the bonding pads included tin.

9. The structure of claim 1, wherein each of the plurality of the plated-through hole structures comprises:

a through hole, penetrating through the first laminate structure, the interlayer and the second laminate structure;
a seed copper layer disposed on a sidewall of the through hole; and
a plating layer disposed on the seed copper layer and covering the first and third metal layers.

10. The structure of claim 9, wherein each of the plurality of the plated-through hole structures further comprises a filling plug surrounded by the plating layer.

11. A package structure, comprising:
a first laminate structure having a first dielectric layer and a first metal layer disposed below the first dielectric layer;
a second laminate structure having at least a cavity therein, wherein the second laminate structure consists of a second metal layer and a second dielectric layer disposed on the second metal layer;
an interlayer joining the first laminate structure and the second laminate structure, wherein the first metal layer is joined to a surface of the interlayer and the second dielectric layer of the second laminate structure is joined to the opposite surface of the interlayer;
a plurality of bonding pads, located within the at least cavity and on the first metal layer, wherein the at least cavity exposes a portion of the interlayer and the plurality of bonding pads;
a plurality of plated-through hole structures, extending through the first laminate structure, the interlayer and the second laminate structure;
a top solder resist coating covering a top surface of the first dielectric layer and the plurality of plated-through hole structures;
a bottom solder resist coating over the plurality of plated-through hole structures and the second laminate structure;
at least an electronic component, electrically connected to and mounted on the plurality of the bonding pads; and
an encapsulant, filling up the at least cavity and encapsulating the at least electronic component.

12. The structure of claim 11, wherein each of the plurality of the plated-through hole structures comprises:
a through hole, penetrating through the first laminate structure, the interlayer and the second laminate structure;
a seed copper layer disposed on a sidewall of the through hole; and
a plating layer disposed on the seed copper layer and covering the second metal layer.

13. The structure of claim 12, wherein each of the plurality of the plated-through hole structures further comprises a filling plug surrounded by the plating layer.

14. The structure of claim 11, wherein a material of the first and/or second metal layers includes copper.

15. The structure of claim 11, wherein the interlayer is made of a no-flow pre-impregnated material.

16. The structure of claim 11, further comprising a plurality of bumps disposed between the at least electronic component and the plurality of the bonding pads.

17. The structure of claim 16, wherein a material of the bumps includes copper or gold.

18. The structure of claim 11, further comprising a plurality of balls disposed on the second laminate structure.

19. The structure of claim 11, wherein a material of the bonding pads included tin.

* * * * *